United States Patent
Lamborn et al.

(10) Patent No.: US 12,087,693 B2
(45) Date of Patent: Sep. 10, 2024

(54) NON-CONDUCTIVE ETCH STOP STRUCTURES FOR MEMORY APPLICATIONS WITH LARGE CONTACT HEIGHT DIFFERENTIAL

(71) Applicant: Intel NDTM US LLC, Santa Clara, CA (US)

(72) Inventors: Daniel R. Lamborn, Hillsboro, OR (US); Chuan Sun, Singapore (SG); Qi Zhou, Liaoning (CN)

(73) Assignee: Intel Corporation, Santa Clara, CA (US)

( * ) Notice: Subject to any disclaimer, the term of this patent is extended or adjusted under 35 U.S.C. 154(b) by 361 days.

(21) Appl. No.: 17/441,217

(22) PCT Filed: May 9, 2019

(86) PCT No.: PCT/CN2019/086118
§ 371 (c)(1),
(2) Date: Sep. 20, 2021

(87) PCT Pub. No.: WO2020/223945
PCT Pub. Date: Nov. 12, 2020

(65) Prior Publication Data
US 2022/0148971 A1    May 12, 2022

(51) Int. Cl.
| | | |
|---|---|---|
| H10B 43/50 | (2023.01) | |
| H01L 21/768 | (2006.01) | |
| H01L 23/528 | (2006.01) | |
| H01L 23/535 | (2006.01) | |
| H10B 41/50 | (2023.01) | |
| H10B 43/27 | (2023.01) | |

(52) U.S. Cl.
CPC ...... *H01L 23/535* (2013.01); *H01L 21/76805* (2013.01); *H01L 21/76816* (2013.01);
(Continued)

(58) Field of Classification Search
CPC ......... H01L 21/76805; H01L 21/76816; H01L 21/76829; H01L 21/76834;
(Continued)

(56) References Cited

U.S. PATENT DOCUMENTS 9,659,811 B1 * 5/2017 Peng ................ H01L 21/76807
2017/0092580 A1   3/2017 Huang et al.
(Continued)

FOREIGN PATENT DOCUMENTS

| CN | 108630694 A | 10/2018 |
|---|---|---|
| JP | 2016046439 A | 4/2016 |

(Continued)

OTHER PUBLICATIONS

Japanese and English Translation of Japanese Office Action for Patent Application No. 2021-557115, Mailed Nov. 2, 2023, 7 pages.
(Continued)

*Primary Examiner* — Daniel P Shook
(74) *Attorney, Agent, or Firm* — Compass IP Law PC

(57) ABSTRACT

Etch stops are disclosed for integrated circuit applications that have a set contacts of varying height, wherein there is a large height differential between the shortest and tallest contacts. In one example, an etch stop is provisioned over a 3D NAND memory staircase structure. The structure is then planarized with an insulator material that can be selectively etched with respect to the etch stop. Contact holes that land on corresponding wordlines of the staircase are etched. Due to the nature of the staircase, the holes vary in depth depending on which step of the staircase they land. The etch stop under the shallowest hole remains intact while the deepest hole is etched to completion. Once all holes have landed on the etch stop, a further etch selective to the
(Continued)

insulator material is carried out to punch through the etch stop and expose underlying wordlines. Contacts are deposited into the holes.

22 Claims, 8 Drawing Sheets

(52) U.S. Cl.
CPC .. *H01L 21/76829* (2013.01); *H01L 21/76895* (2013.01); *H01L 23/5283* (2013.01); *H10B 43/50* (2023.02); *H10B 41/50* (2023.02); *H10B 43/27* (2023.02)

(58) Field of Classification Search
CPC ... H01L 21/76895; H10B 41/27; H10B 41/50; H10B 43/27; H10B 43/50
See application file for complete search history.

(56) References Cited

U.S. PATENT DOCUMENTS

2018/0330985 A1 11/2018 Yu et al.
2019/0067306 A1* 2/2019 Fang .................... H10B 41/20

FOREIGN PATENT DOCUMENTS

JP 2015138941 A 5/2017
JP 2019024087 A 2/2019
JP 2019510362 A 7/2019

OTHER PUBLICATIONS

Extended European Search Report for Patent Application No. 19927755.9, Search Completed Nov. 14, 2022, 8 pages.

Japanese and English Translation of Japanese Office Action for Patent Application No. 2021-557115, Mailed May 30, 2023, 12 pages.

International Search Report and Written Opinion for PCT Patent Application No. PCT/CN2019/086118, Mailed Jan. 23, 2020, 7 pages.

Japanese and English Translation of Japanese Examination Report for Patent Application No. 2021-557115, Mailed Mar. 25, 2024, 10 pages.

Korean Notice of Preliminary Rejection for Patent Application No. 10-2121-7032445, Mailed May 16, 2024, 10 pages.

* cited by examiner

Single Layer, continuous single phase.

Single Layer, continuous multiphase.

Multi-layer, each layer a distinct single phase.

Multi-layer, one single phase, one multi-phase.

Multi-layer, each distinct layer multi-phase.

NON-CONDUCTIVE ETCH STOP STRUCTURES FOR MEMORY APPLICATIONS WITH LARGE CONTACT HEIGHT DIFFERENTIAL

CLAIM OF PRIORITY

This application is a U.S. National Phase application under 35 U.S.C. § 371 of International Application No. PCT/CN2019/086118 filed May 9, 2019, entitled "NON-CONDUCTIVE ETCH STOP STRUCTURES FOR MEMORY APPLICATIONS WITH LARGE CONTACT HEIGHT DIFFERENTIAL", the entire contents of which are incorporated herein by reference.

BACKGROUND

In two-dimensional (2D) NAND memory technology, memory cells are arranged in a side-by-side layout or array on a single die. The storage capacity is determined by the number of cells in the array. In effort to track with Moore's Law, manufacturers have been scaling down memory cell sizes to fit more cells on a given die. Eventually, technological limits with respect to how much a cell can be shrunk will be reached. To this end, three-dimensional (3D) NAND memory technology is intended to address some of the challenges encountered in scaling 2D NAND memory technology. Rather than a single layer of memory cells on a die, a 3D NAND memory structure includes multiple layers of vertically stacked memory cells. As such, 3D NAND memory technology can be used to increase capacity in a given footprint without necessarily shrinking of the memory cells. However, there are a number of non-trivial issues associated with 3D NAND memory technology, particularly as dimensions continue to scale.

DETAILED DESCRIPTION

Figure 1:
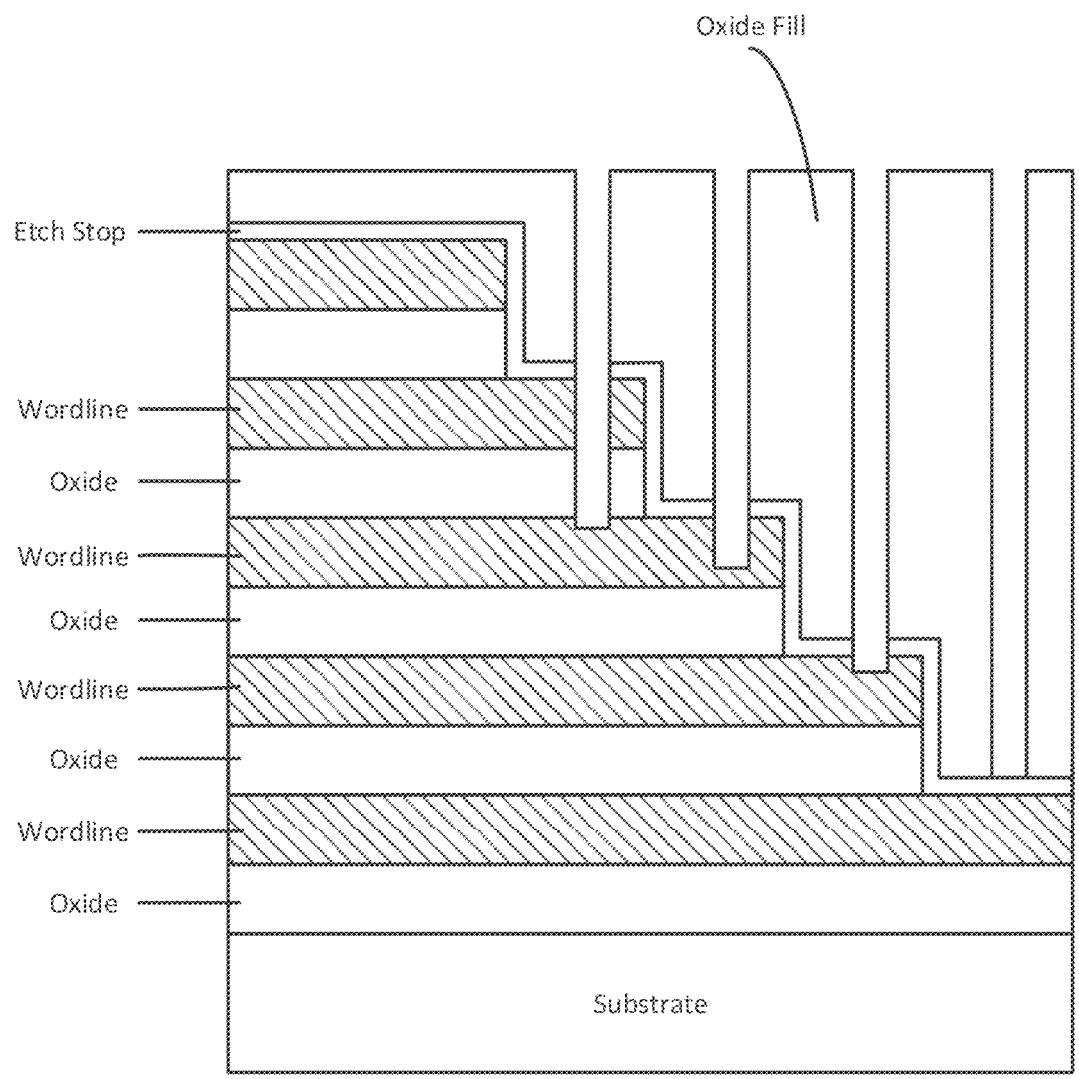
FIG. 1 shows an example 3D integrated circuit NAND memory staircase structure illustrating the problematic penetration of a wordline by a corresponding contact (or via) that is relatively shorter than the tallest contact that lands on a wordline which is lower in the staircase structure.

Non-conductive etch stops are disclosed for integrated circuit applications that have a set contacts or vias of varying height, wherein there is a relatively large height differential between the shortest and tallest contacts in that set. The etch stops are particularly well-suited for 3D NAND memory applications, where contacts of varying height are formed on corresponding conductive layers (e.g., wordlines) of a staircase structure, although other applications having diverse contact height across a given structure can benefit as will be apparent. In an embodiment, a non-conductive etch stop is provisioned over a 3D NAND memory staircase structure. After the etch stop is formed, the remaining open space of the staircase structure is filled in or otherwise planarized with an insulator material (e.g., oxide) that can be selectively etched with respect to the etch stop. Contact holes that will land on corresponding conductive layers of the staircase structure are then patterned and etched. Due to the nature of the staircase structure, the holes vary in height (depth) depending on which step of the staircase structure they land. To this end, and according to an embodiment, the etch stop under the shallowest hole remains intact while the deepest hole is etched to expose the etch stop thereunder. Once all the contact holes have landed on the underlying etch stop, a further etch selective to the insulator material (i.e., an etch that removes the etch stop but not the insulator material) can then be carried out to punch through the etch stop and expose the underlying conductor layers. Conductive contacts can then be formed in the contact holes. In one such embodiment, a first contact on an upper step of the staircase structure has a first height, and a second contact on lower step of the staircase structure has a second height that is more than 5× greater than the first height. As will be appreciated in light of this disclosure, the etch stop prevents non-uniform etching of the conductor layers underlying the etch stop. In some such embodiments, the etch stop is a single layer that is composed of a material having high etch selectivity with respect to the given insulator material. In other embodiments, the etch stop is a bilayer or multi-layer structure that includes a first layer and a second layer of materials having high etch selectivity with respect to the given insulator material. In some example embodiments, the etch stop includes at least one layer of high-k dielectric (e.g., hafnium oxide or other high-k oxide). As will be appreciated in light of this disclosure, the slower etch rate of the etch stop effectively protects the conductive layers (e.g., wordlines) located higher in the staircase structure from being etched or otherwise penetrated during the contact hole etching process to reach the conductive layers located lower in the staircase structure. Further note that the non-conductive nature of the etch stop eliminates any shorting risk between wordline layers. As will be appreciated, the terms "contact" or "contact structure" as used herein generally refer to a hole filled with conductive material (e.g., metal), and may be used interchangeably with "via" or "via structure."

General Overview

As noted above, there are a number of non-trivial and unresolved issues associated with the continued downscaling of 3D NAND memory technology, particularly with respect to the need to form contacts to the wordlines within a 3D staircase structure. Simply stated, increasing the number of staircase levels results in more challenging etch applications, particularly with respect to a staircase structure design where taller contact holes on the lower steps of the staircase structure have a height-to-width ratio of 20:1, or higher. One subtle issue that arises in such high aspect ratio etch applications is that the contact hole etch process for the shallower holes etches into (or even through) wordlines located higher in the staircase structure as the etch process continues through the insulator fill material to form the deeper holes that land on wordlines located lower in the staircase structure. An etch stop can be used to help alleviate this problem, but the etch stop must account for contact hole depth diversity of the staircase structure; otherwise, the etch stop will fail.

For instance, FIG. 1 shows an example 3D integrated circuit NAND memory staircase structure illustrating non-uniform contact hole etch across the staircase structure, resulting in diversity in wordline thickness and potential latent defects. As can be seen, the staircase structure includes multiple alternating layers of oxide and wordline material above a substrate, such that each step of the staircase structure includes an oxide layer and a wordline layer. The lowest step in the staircase is more than 5× lower than the upper step of the staircase structure. An etch stop is provided over the staircase structure, and an oxide fill material is provided over the etch stop to planarize the staircase structure. As can be further seen, a series of contact holes have been patterned and etched for wordline contacts. However, because of the ineffectiveness of the etch stop and the substantial hole depth difference between the shallowest hole (leftmost hole) and deepest hole (rightmost hole), the etching may punch through a target wordline and even etch into the wordline material below the target wordline (e.g., as can be seen in the leftmost hole in FIG. 1), which ultimately results in a short-circuit between those two wordlines. Even if such punch through doesn't occur, note that the etching of the shallower contact holes has still penetrated the etch stop and further etched into underlying wordlines, thereby leaving non-uniform wordline recess across the spectrum of wordlines being connected (e.g., as can be seen in the two middle holes in FIG. 1). The end result is yield fallout in the case of shorting, or the more subtle and unexpected condition of latent defects due to non-uniform wordline recess, where an overly thinned wordline eventually matures into a fully open wordline.

Thus, and in accordance with an embodiment of the present disclosure, a non-conductive etch stop is provided. The etch stop is particularly well-suited to integrated circuit applications that have varying contact hole depths that are etched in the same etch process. For instance, the etch stop can be provisioned over a 3D NAND memory staircase structure, such as the one shown in FIG. 1. The etch stop effectively protects the wordline material in the 3D staircase structure during etching applications by providing an adequate differential etch rate relative to the surrounding insulator fill material that is over the etch stop. Numerous variations and embodiments will be appreciated in light of this disclosure.

In some example embodiments, the etch stop is a single layer structure that includes a high-k dielectric material. Example high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to name some examples. In some specific such examples, the etch stop is aluminum oxide, hafnium oxide, or yttrium oxide. The high-k dielectric material can be annealed to improve its etch selectivity.

In other embodiments, the etch stop structure may include multiple layers. For instance, in some such example cases, the etch stop includes a bilayer structure composed of two compositionally different layers. In one such example embodiment, a first layer on the staircase structure includes a high-k dielectric material such as aluminum oxide ($Al_xO_y$), hafnium oxide ($HfO_x$), zirconium oxide ($ZO_x$), yttrium oxide ($Y_xO_y$), or other high-k material(s), and a second layer (that is on the first layer) includes silicon nitride ($Si_xN_y$), silicon oxynitride ($SiO_xN_y$), or silicon oxide ($SiO_x$). Alternatively, in another embodiment, the first layer on the staircase includes an oxide, nitride, or oxynitride, and the second layer on the first layer includes high-k dielectric material(s). In any such cases, the second layer allows for a first delay period before the first layer is reached, and the first layer allows for a second delay period. These delays can be factored into the overall timing of the etch process to ensure that the high-k material is not fully consumed at any point in time prior to the punch through process.

Further note that in any such embodiments, whether the etch stop structure is a single layer or multiple layers, one or more components of that etch stop may be graded. For instance, in one example case, the etch stop includes a single continuous layer that begins with a first outer phase or portion (e.g., silicon oxide) that transitions to a second inner portion (e.g., hafnium silicon oxide). In still other embodiments, the etch stop may include an inner layer containing high-k dielectric material that is on the staircase, and a second distinct outer layer that has a first outer portion of silicon oxide that gradually transitions to a second inner portion of silicon oxynitride that is on the high-k dielectric material. In such a case, the etchant will first encounter the outer silicon oxide phase and may consume that material in a relatively quick manner (particularly if the fill insulator is also silicon oxide), but then the etch rate will slow as the nitrogen content of the inner silicon oxynitride phase is encountered. The etch rate will slow even further when the high-k electric material layer is encountered. Further note that the abruptness of the transition from one material or layer to the next may vary as well. For instance, in some cases the grading of a material concentration is done in a relatively course step-like fashion, such that the transition from one material to the next is relatively abrupt and therefore the transitions remain distinct and detectable as independent layers of the etch stop. In other cases, however, the grading may be carried out in relatively much smaller increments, such that the transition from one material to the next is smooth or otherwise non-abrupt and therefore the etchstop is more akin to a single continuous layer that has multiple phases or portions.

The thickness of the etch stop structure can vary from one embodiment to the next, depending on factors such as the etch chemistry used, the etch selectivity between the insulator and etch stop materials used, and the difference in depth between the shallowest hole and the deepest hole being formed during a given contact hole etch process, according to some embodiments. In some such example cases, the thickness of the overall etch stop is in the range of 15 nm to 150 nm (e.g., 50 to 125 nm, such as 70 nm, or 80 nm, or 90 nm, or 100 nm, or 110 nm), but it can be thinner or thicker, depending on factors noted above. For instance, in other embodiments the thickness of the etch stop is in the range of 2 nm to 15 nm (e.g., 5 nm, or 10 nm), while in still other embodiments the etch stop is in the range of 150 to 200 nm (e.g., 175 nm). As further noted above, the etch stop structure may have different etch rates for each phase or layer of the overall structure, and the thickness of each such phase and/or layer can be set to achieve an overall timed etch process engineered to etch all contact holes of a given staircase structure without prematurely punching through etch stop.

In any such cases, once the etch stop is deposited over the 3D staircase structure (or some other depth-diverse structure), then an insulator material is deposited over the etch stop to planarize the structure, according to an embodiment. The insulator fill material should be selectively etchable with respect to the etch stop, and in some embodiments is silicon oxide or porous silicon oxide or a polymer, to name a few examples. So, for example, for a given etch chemistry, an etch stop that includes high-k dielectric material(s), and optionally further includes materials such as nitrides and oxynitrides, will etch relatively much slower than an oxide fill material. The holes for the contacts can then be patterned and etched into insulator fill, down to etch stop just above the respective wordlines. During the etching of the insulator fill, the etch rate is generally uniform until the etch stop is encountered. From that point on in the corresponding contact hole, the etch rate of the exposed etch stop is much slower (e.g., 10× slower, or more) than the etch rate of the insulator fill in the deeper contact holes, as the etch process continues to run. Here, the slower etch rate of the etch stop robustly protects the wordline material or other material below the etch stop from being inadvertently thinned or otherwise etched.

In a specific embodiment, for instance, the etch selectivity of insulator material to etch stop material is, on average, greater than 15:1, such that the etch stop (or at least a portion of the etch stop) etches more than 15 times slower than the insulator fill material, for a given etch chemistry. As will be appreciated, however, note that etch selectivity can vary from one embodiment to the next depending on factors such as the material(s) chosen for the etch stop and insulator fill, the depth difference between the shallowest and deepest contact holes being etched, and etch chemistries utilized. In a more general sense, any etch selectivity that enables the etching of the insulator fill material to form the desired contact holes while consistently and reliably protecting the wordline material below the etch stop can be used. So, in still other example embodiments, the etch selectivity of the insulator fill material to the etch stop material is in the range of about 5:1 to about 50:1, such as about 10:1, or about 20:1, or about 30:1, or about 40:1, or higher. In the case of a multi-layer or multi-phase etch stop, recall that the etch stop structure can have multiple etch rates (one or more etch rates for each different layer or phase of the etch stop) that effectively provide an overall etch rate that is suitable. The overall all etch rate can be, for instance, an average or median etch rate that accounts for all the etch rates making up a given etch stop structure.

So, according to some embodiments, the differential etch rate of the etch stop over the 3D staircase structure allows for etching of contact holes of varying depths while effectively preventing penetration of the etch stop and etching of the wordlines below the shallower contact holes. Moreover, the differential etch rate of the etch stop effectively eliminates non-uniform wordline recess across the spectrum of wordlines and punch through of wordlines, in some cases. This in turn provides increased yield due to the effective elimination of over-etch shorts. The differential etch rate also increases the number of contact holes of varying depths that can be etched using a single hardmask. This produces improvements and efficiencies in the 3D NAND memory staircase contact process. Numerous other such benefits, as well as other configurations and embodiments, will be apparent.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some example embodiments, such tools may indicate the presence of an etch stop structure (e.g., by way of a TEM cross-section image) that includes a high-k dielectric material over a 3D NAND memory staircase structure, as well as wordlines of uniform thickness under their respective contacts (or vias).

Materials that are compositionally different as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., boron, silicon, gallium, and magnesium) or the same dopants but at differing concentrations. In still other embodiments, compositionally different may further refer to two materials that have different crystallographic orientations. For instance, (110) silicon is different from (100) silicon. Creating a stack of different orientations could be accomplished, for instance, with blanket wafer layer transfer.

It is noted that designations such above or below or top or bottom or top side or bottom side are not intended to necessarily implicate a limitation as to orientation of the embodiments described herein. Rather, such terminology is simply used in a relative sense to consistently describe a structure as it exists in any one particular orientation and as illustrated herein.

As used herein, the term high-k refers to materials having a dielectric constant greater than that of silicon dioxide (e.g., a k value greater than approximately 3.9). Examples of high-k dielectric materials include, for instance, hafnium oxide, hafnium silicon oxide, zirconium oxide, zirconium silicon oxide, lanthanum oxide, lanthanum aluminum oxide, and titanium oxide, tantalum oxide, barium strontium titanium oxide, barium titanium oxide, strontium titanium oxide, yttrium oxide, aluminum oxide, lead scandium tantalum oxide, and lead zinc niobite. Any other high-k material can be used as well. Moreover, note the stoichiometry of such high-k dielectric compounds may vary from one embodiment to the next, and such compounds represented without stoichiometric coefficients or values are intended to represent all forms of that high-k dielectric compound.

As used herein, the term layer refers to a material portion including a region with a thickness. A monolayer is a layer that consists of a single layer of atoms of a given material. A layer can extend over the entirety of an underlying or overlying structure, and may have an extent less than the extent of an underlying or overlying structure. A layer can extend horizontally, vertically, and/or along a tapered or non-linear surface. A layer can be conformal to a given surface (whether flat or curvilinear) with a relatively uniform thickness across the entire layer, but need not be conformal or otherwise uniform. A single layer may have a graded component or multiple phases, such that the layer is not homogenous.

Methodology

Figure 2:
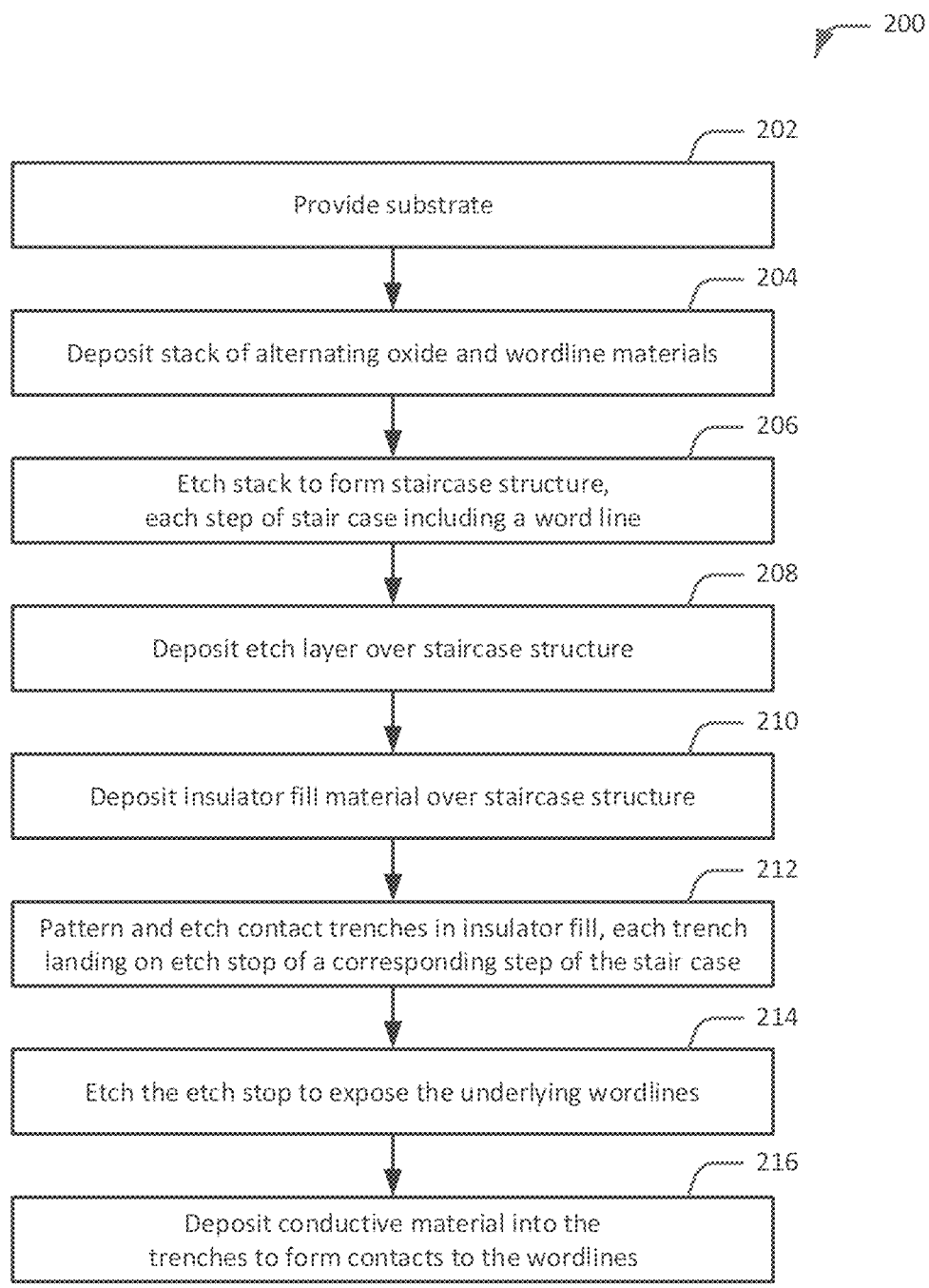
FIG. 2 illustrates an example process for forming an etch stop for 3D integrated circuit staircase structures, in accordance with an embodiment of the present disclosure.

FIG. 2 illustrates an example process 200 for forming an etch stop for 3D integrated circuit staircase structures, in accordance with an embodiment of the present disclosure. FIGS. 3A-3I illustrate cross-sectional views of example 3D integrated circuit staircase structures formed when carrying out process 200 of FIG. 2, in accordance with an embodiment of the present disclosure. As will be further appreciated, the outlined operations are only provided as examples, and other embodiments may include fewer discrete operations (such as the example case where 208 and 210 are performed in a single continuous deposition process where process knobs are adjusted to provide the desired materials), and other embodiments may include operations not shown (such as planarization/polishing and cleaning operations). Many variations will be apparent in light of this disclosure. Concurrent reference to FIG. 2 and FIGS. 3A-3I will facilitate explanation.

Note that deposition of materials as variously described herein can be accomplished with any suitable deposition techniques, such as chemical vapor deposition (CVD), physical vapor deposition (PVD), atomic layer deposition (ALD), and/or molecular beam epitaxy (MBE). Also note that etching of materials as variously described herein can be accomplished any suitable etching techniques, such as wet and/or dry etch processing which may be isotropic (e.g., uniform etch rate in all directions) or anisotropic (e.g., etch rates that are orientation dependent), and which may be non-selective (e.g., etches all exposed materials at the same or similar rates) or selective (e.g., etches different materials that are exposed at different rates). Further note that other processing may be used to form the integrated circuit structures described herein as will be apparent in light of this disclosure, such as patterning or lithography, planarizing or polishing (e.g., chemical-mechanical planarization), doping (e.g., ion implantation, in situ doping), cleaning, and annealing.

Figure 3A:
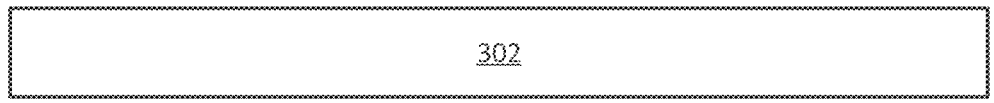
FIGS. 3A-3I each illustrates a cross-sectional view of an example 3D integrated circuit staircase structure formed at different points during the process of FIG. 2, in accordance with an embodiment of the present disclosure.

With reference to FIG. 2, process 200 commences at 202 with providing a substrate. FIG. 3A shows an example substrate 302, in accordance with an embodiment. Any number of suitable substrates can be used here, including bulk substrates, semiconductor-on-insulator substrates (XOI, where X is a semiconductor material such as silicon, germanium, SiGe, gallium arsenide, or indium gallium arsenide), and multi layered substrate structures. In a more general sense, any substrate upon which 3D NAND memory can be formed can be used. In one specific embodiment, substrate 302 is a bulk silicon substrate.

Figure 3B:
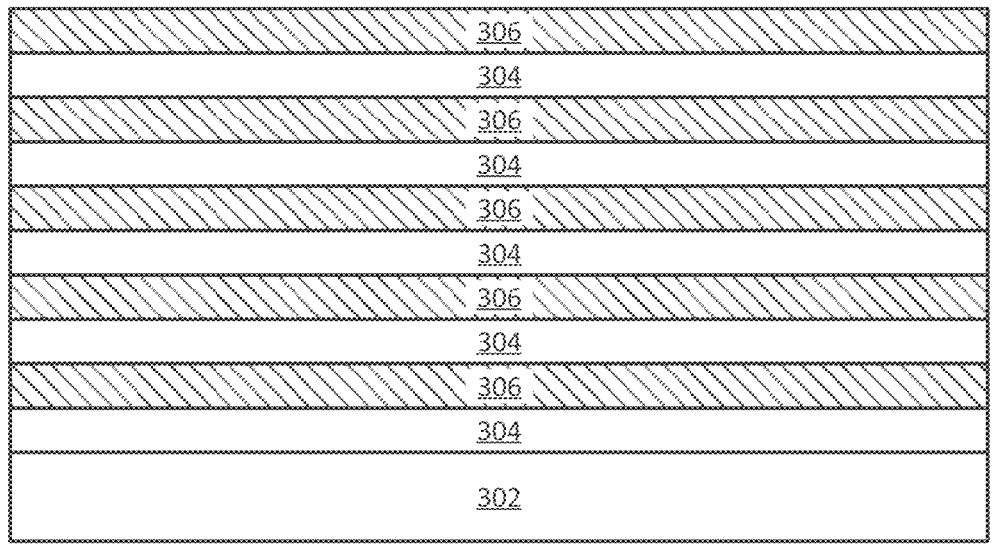

Process 200 continues at 204 with depositing a stack of alternating insulator (e.g., oxide) and word line materials on the substrate to form a standard or proprietary stack. Although any number of insulator and wordline materials can be used, one embodiment includes silicon oxide for the insulator layers and polysilicon for the wordline layers. FIG. 3B shows an example alternating oxide and wordline stack comprised of oxide layers 304 and wordline layers 306, according to an embodiment. Oxide layers 304 and wordline layers 306 can be deposited using any suitable deposition technique, such as ALD, CVD, PVD, or any combination of suitable deposition techniques. In one specific embodiment, each oxide layer 304 and wordline layer 306 is deposited using CVD. Note that although the structure shown in FIG. 3B includes an oxide deposited first, followed by wordline material, oxide, wordline material, oxide, and so on, other embodiments may have a different stack such as those where wordline material is deposited first, followed by insulator material, wordline material, and so on.

Each oxide layer 304 in the stack can have the same thickness or have different thicknesses. For example, in some embodiments, each oxide layer 304 has a thickness in the range of about 10 nm to about 100 nm. In one specific such embodiment, each oxide layer 304 has a thickness of about 20 nm to 30 nm (e.g., 25 nm). Similarly, each wordline layer 306 in the stack can have the same thickness or have different thicknesses. For example, in some embodiments, each wordline layer 306 has a thickness in the range of about 10 nm to about 100 nm. In one specific such embodiment, each wordline layer 306 has a thickness of about 30 nm to 40 nm (e.g., 35 nm). In a more general sense, the thickness of the insulator layers 304 and the wordline layers 306 can vary greatly, as will be appreciated.

The stack can include any number of alternating layers of oxide 304 and wordline 306 materials. For example, in some specific example embodiments, the stack includes between 20 and 500 or so layers (counting both 304 and 306). In a more general sense, the number of alternating insulator layers or structures and conductor layers or structures in the stack can vary greatly, depending on the particulars of the memory being formed, and the techniques provided herein can be used to the benefit of any such configurations, as will be appreciated.

Figure 3C:
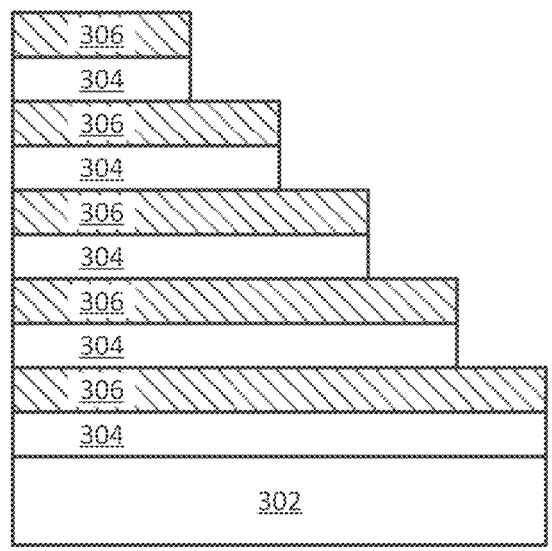

Process 200 continues at 206 with etching the stack to form a staircase structure on the substrate. FIG. 3C shows an example staircase structure including alternating layers of oxide layer 304 and wordline layer 306 on substrate 302, in accordance with one such embodiment. A staircase structure generally includes two or more steps, where the riser of at least some of the steps includes an insulator layer or structure 304 and a wordline layer or structure 306. Note that, in the example embodiment shown, the top layer of each step in the staircase structure is a wordline 306, but in other embodiments the top layer of each step can be an insulator 304. So, in some example embodiments having 48 to 512 layers in the stack, the resulting staircase structure includes between 24 and 256 steps (e.g., 32 steps, 64 steps, 96 steps, 128 steps). In a more general sense, the staircase can be configured with any number of steps, depending on the particulars of the given memory application.

The staircase structure can be formed with standard staircase etch processing, or any other suitable etch process. For example, in one embodiment, a hardmask is provisioned over the stack of alternating layers of oxide layer 304 and wordline layer 306. The hardmask is then photographically patterned and etched to the depth of a single step, and the riser including topmost wordline layer 306 and oxide layer 304 is exposed. The hardmask is then etched sideways (sometimes called a pull-back etch) to the tread width of the next step, and the next pair of wordline 306 and oxide 304 are etched to the depth of a single step, and the riser of that next step is formed. This process is repeated for each step of the staircase, until the staircase is formed. Although the example staircase structure of FIG. 3C shows four or five steps, any number of steps can be provisioned, as previously explained.

Figure 3D:
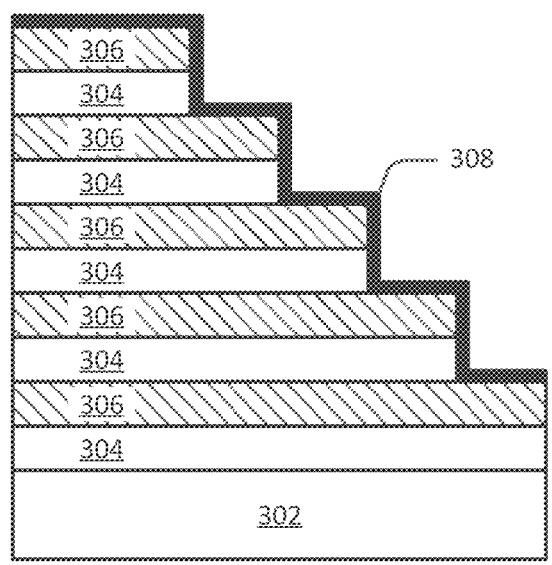

Process 200 continues at 208 with depositing the etch stop layer over the staircase structure. FIG. 3D shows an example etch stop 308 formed over the staircase structure, in accordance with an embodiment. Recall etch stop 308 can have a number of configurations, which will be discussed in turn with respect to FIGS. 3J-N. In some embodiments, the etch stop is formed by conformally depositing a non-conductive high-k dielectric material that has high etch selectivity with respect to the fill insulator to be used to fill in or otherwise planarize the staircase structure. In some such embodiments, the high-k dielectric material of the etch stop is annealed to further improve its etch selectivity. Etch stop 308 can be deposited using any suitable conformal deposition technique, such as ALD, CVD, PVD, or diffusion. In one specific embodiment, etch stop 308 is deposited using PVD.

Figure 3E:
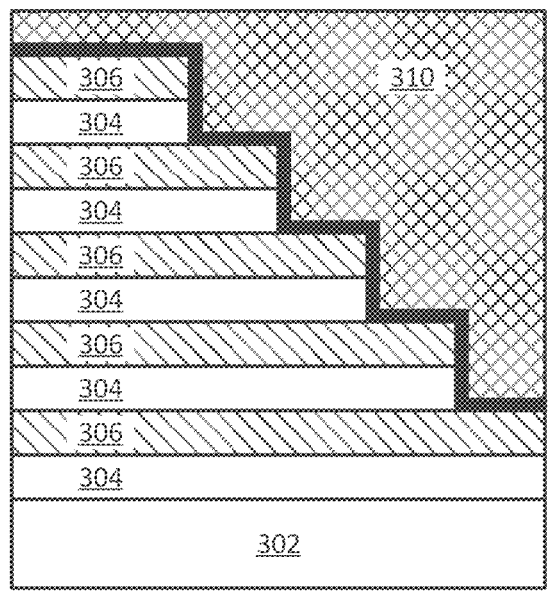
Figure 3F:
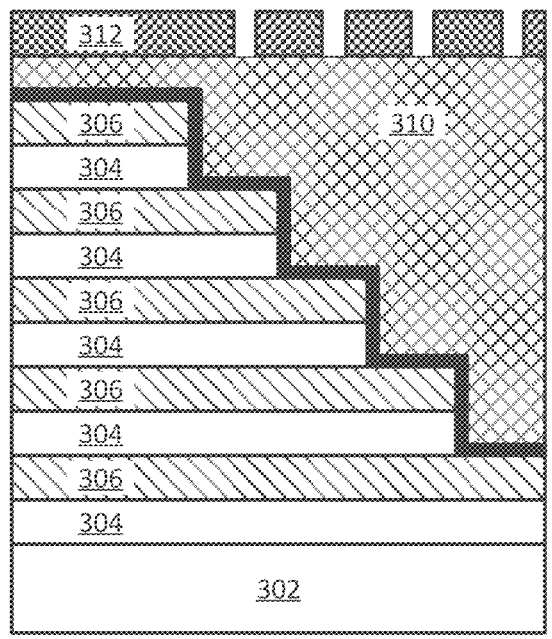
Figure 3G:
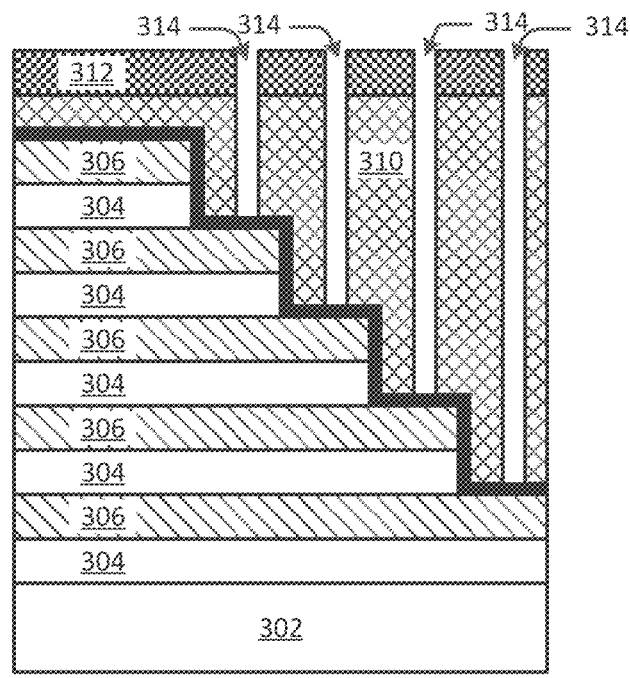
Figure 3H:
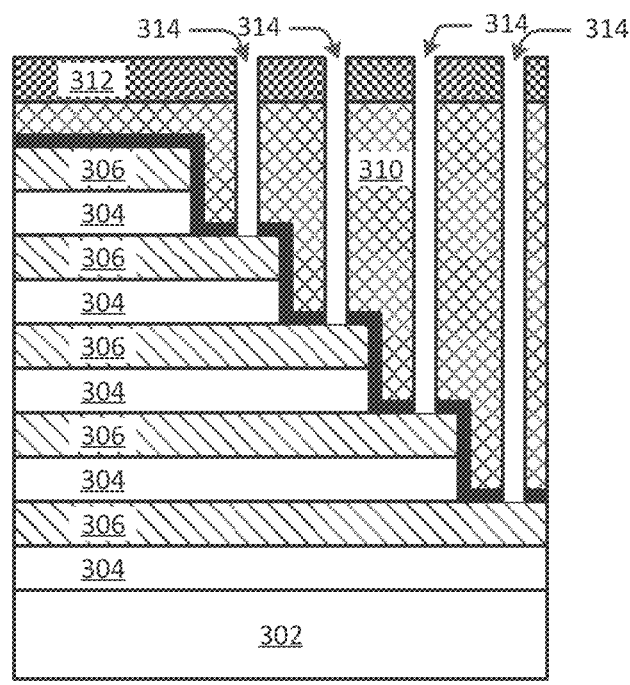
Figure 3I:
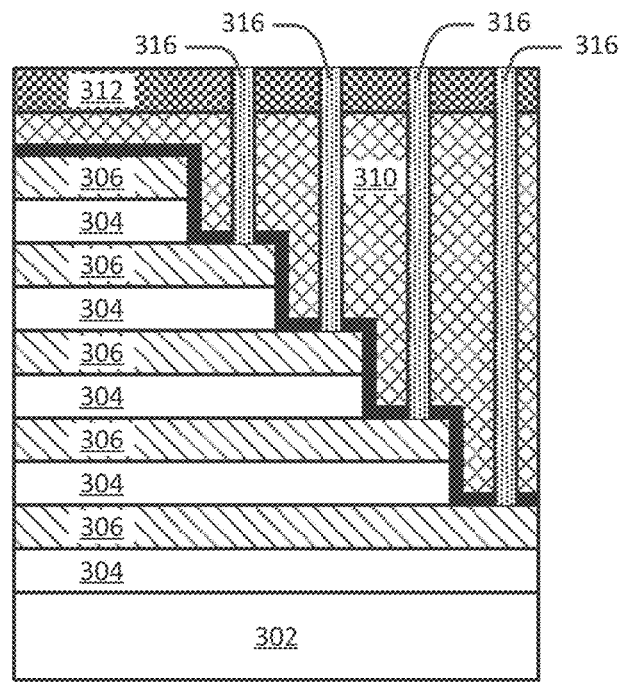
Figure 3J:
FIGS. 3J-N each illustrates an example configuration of an etch stop for 3D integrated circuit staircase structures, in accordance with an embodiment of the present disclosure.
Figure 3K:
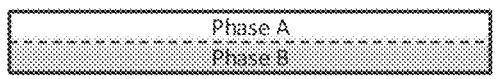

In some example embodiments, the etch stop 308 is a single layer structure that includes a high-k dielectric material. Example high-k dielectric materials include, for instance, those previously provided herein. One such embodiment is shown in FIG. 3J, which shows a single layer having a single continuous phase. In some specific such examples, that single layer is aluminum oxide, hafnium oxide, zirconium oxide, or yttrium oxide. Another example single layer embodiment is shown in FIG. 3K, which shows an etch stop that includes a single continuous layer that begins with a first phase A that transitions to a second phase B. The transition from phase A to phase B is relatively gradual and depicted using a dashed line. One such example case is where the single continuous layer etch stop 308 includes a first phase A of silicon oxide that transitions to a second phase B of hafnium silicon oxide. In another example such case is where the single continuous layer etch stop 308 includes a first phase A of aluminum oxide that transitions to a second phase B of lanthanum aluminum oxide. Note that one or more phases of the single continuous layer may include a high-k dielectric material, but they need not all include a high-k dielectric.

Figure 3L:
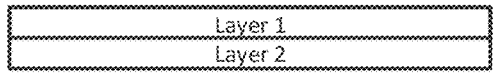

In other embodiments, the etch stop 308 structure may include multiple layers. For instance, in one example case, the etch stop 308 includes a bilayer structure composed of two compositionally different layers. One such embodiment is shown in FIG. 3L. In one such example case, layer 1 includes silicon nitride ($Si_xN_y$), silicon oxynitride ($SiO_xN_y$), or silicon oxide ($SiO_x$), and layer 2 (on the staircase) includes a high-k dielectric material such as aluminum oxide ($Al_xO_y$), hafnium oxide ($HfO_x$), zirconium oxide ($ZO_x$), or other high-k material(s). As previously explained, note that layer 1 effectively allows for a first delay period before the high-k material of layer 2 is reached, and layer 2 effectively allows for a second longer delay period. Just as with the delay(s) associated with a single continuous layer, these delays can be factored into the overall timing of the etch process to ensure that the high-k material of layer 2 is not fully consumed at any point in time during the overall etch process. Note that the layer containing the high-k material need not be on the staircase. Specifically, in an alternative embodiment, layer 1 can include the high-k dielectric material(s), and layer includes an oxide, nitride, or oxynitride, as previously explained.

Figure 3M:
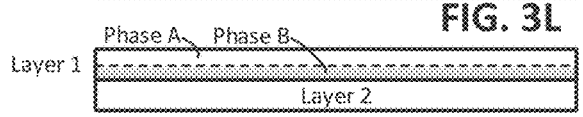

In still other embodiments, the etch stop 308 may include an inner layer containing high-k dielectric material that is on the staircase, and a second distinct outer layer that has a first outer phase that gradually transitions to a second inner phase that is on layer 2. One such embodiment is shown in FIG. 3M. In one specific such example case, layer 2 contains a high-k dielectric material (e.g., $Al_xO_y$) that is on the staircase, and layer 1 has a first phase A of silicon oxide that gradually transitions to a second phase B of silicon oxynitride that is on the high-k dielectric material. As previously explained, in such a case, the etchant will first encounter the outer silicon oxide phase A and may consume that material in a relatively quick manner (particularly if the fill insulator is also silicon oxide), but then the etch rate will slow as the nitrogen content of the inner silicon oxynitride phase B is encountered. The etch rate will slow even further when the high-k electric material layer 2 is encountered.

Figure 3N:
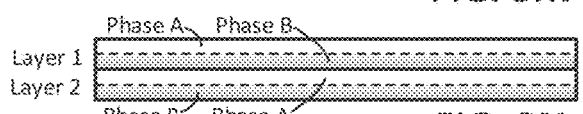

FIG. 3N shows another example multi-layer, multi-phase embodiment, where each distinct layer of an etch stop 308 having a bi-layer structure includes different phases. In one specific such example case, layer 2 has a first phase A of aluminum oxide that gradually transitions to a second phase B of lanthanum aluminum oxide or hafnium oxide that, and layer 1 has a first phase A of silicon oxide that gradually transitions to a second phase B of silicon oxynitride. As previously explained, the overall contact etch sequence can include any number of timed etch sub-processes each associated with a particular etch rate.

The thickness of the etch stop structure 308 can vary from one embodiment to the next, depending on factors such as the etch chemistry used, the etch selectivity between the insulator and etch stop materials used, and the difference in height between the treads of the uppermost and lowermost stairs in the staircase structure), according to some embodiments. Note that the difference in height between the treads of the uppermost and lowermost stairs in the staircase structure effectively defines the major spread in contact hole depths, as will be discussed in turn. Although the techniques provided herein can be used on any staircase structures, they are particularly useful with respect to structures where the height differential between the respective contacts (or vias) on the top and bottom steps is greater than 5×. As previously explained, the thickness of the overall etch stop can vary from one embodiment to the next, but in some cases is in the range of 10 nm to 200 nm (e.g., 15 to 150 nm, or 25 to 125 nm, or 35 to 125 nm, or 45 to 125 nm, or 55 to 125 nm, or 65 to 125 nm, or 75 to 125 nm, or 85 to 115 nm, or 90 to 110 nm, or around 100 nm).

With further reference to FIG. 2, the example process 200 continues at 210 with depositing insulator fill material, according to an embodiment. FIG. 3E shows an example insulator fill 310 formed over etch stop 308 to planarize the integrated circuit structure, in accordance with an embodiment. As previously explained, the insulator fill material 310 is selectively etchable with respect to the etch stop 308, and in some embodiments is $SiO_x$ or porous $SiO_x$, or other oxides and porous oxides. So, for example, for a given etch chemistry, an etch stop 308 that includes high-k dielectric material(s), and optionally further includes materials such as nitrides and oxynitrides, will etch relatively much slower (e.g., more than 15 times slower) than an insulator fill material 310 that is composed of an oxide. Insulator fill 310 can be deposited using any suitable deposition technique, such as ALD, CVD, PVD, or a combination of such techniques. In one specific embodiment, insulator fill 310 is deposited using PVD. Any excess insulator fill 310 can be removed, for instance, with a CMP process that planarizes the structure to a desired height (such as 50 nm to 500 nm above the top step of the staircase, or to the top of the staircase). Note that, in some example embodiments, insulator fill 310 can be the same composition as oxide layers 304 in the staircase structure, but it need not be. Because the staircase structure itself provides a relatively high amount of structural integrity, the insulator fill 310 can be porous to improve its etchability with to the etch stop 308, as will be appreciated.

Process 200 continues at 212 with patterning and etching the contact holes in the insulator fill 310, with each hole landing on the etch stop 308 of a corresponding step of the staircase, according to an embodiment. For example, in an embodiment, a hardmask for etching the holes is patterned and etched. FIG. 3F shows an example resulting hardmask 312, in one such embodiment. Hardmask 312 can be provisioned on insulator fill 310 using any number of suitable processes. For instance, in some embodiments, hardmask 312 can be provided using standard photolithography, including deposition of or more hardmask materials (e.g., such as silicon carbide, silicon dioxide, and/or silicon nitride, or other suitable hardmask materials), patterning resist on a portion of the hardmask 312 that will remain temporarily to protect an underlying region of insulator fill 310, etching to remove the unmasked (no resist) portions of hardmask 312 (e.g., using a dry etch, or other suitable hardmask removal process), and then stripping the patterned resist material, thereby leaving the patterned hardmask 312. The pattern on hardmask 312 provides the pattern for the contact holes that are to be formed. Any number of suitable mask configurations can be used, as will be apparent.

Using the patterned hardmask 312, insulator fill 310 can then be vertically etched to form the contact holes. FIG. 3G shows example holes 314 etched in insulator fill 310, in accordance with an embodiment. As can be seen, each of the holes lands on etch stop 308, but does not penetrate etch stop 308. Although only four holes 314 are shown, any number of holes 314 can be provisioned, as will be appreciated. Any number of dry and/or wet etch processes that are highly selective to the underlying etch stop 308 can be used to etch the contact holes 314 down into insulator fill 310. For instance, in one specific embodiment, a dry etch process can be used that has an etch selectivity of high-k dielectric material included in etch stop 308 relative to insulator fill 310 that is greater than 15:1, meaning that the insulator fill 310 etches more than 15 times faster than the high-k material of etch stop 308. Note that etch stop 308 may be etched somewhat during the contact hole formation process, but will not be penetrated by that etch process, according to an embodiment. To this end, further note that etch stop 308 prevents the creation of non-uniform recess into wordline layers 306, and therefore further prevents unintended punch through of wordline layers 306.

Process 200 continues at 214 with etching the etch stop at the bottom of the contact holes 314 to expose the underlying wordlines 306. FIG. 3H shows an example resulting embodiment. In this portion of the etch process, the etch is selective to the insulator fill material 310 as well as wordline 306 material, and more aggressively removes the etch stop 308 material. The etch utilized will therefore depend on the materials used, as will be appreciated. In some example embodiments, selective wet and/or dry etches that is selective to polysilicon and $SiO_x$ can be used to remove etch stop 308 from the bottom of the holes 314.

For example, and in one such specific embodiment, the etch stop 308 includes a single layer of $Al_xO_y$, and a halide-based dry etch process that is selective to polysilicon and $SiO_x$ is used to selectively remove etch stop 308 from the bottom of the holes 314. In another example case, the etch stop 308 includes a bi-layer configuration having an outer layer of $Al_xO_y$, and an inner layer of $SiO_x$ that is on the tread of the corresponding step. In such a case, a halide-based dry etch process that is selective to the insulator fill 310 can be used to remove the high-k outer layer of etch stop 308, and a secondary dry etch process that is selective to the insulator fill 310 and polysilicon can be used to remove the $SiO_x$ of the inner layer of etch stop 308. Note that in other such example embodiments, the inner and outer layers of etch stop 308 can be reversed, which would in turn reverse the order in which the primary and secondary etchants are applied. Further note that similar etch schemes can be used for an etch stop 308 that has a single layer which includes first and second phases (rather than first and second discrete layers). As will be further appreciated, while specific examples here include polysilicon wordlines, $SiO_x$ fill material, and $Al_xO_y$ high-k layer/portion, numerous other materials systems can be used that provide the etch selectivity variously described herein.

In yet another specific embodiment, assuming a single layer or phase etch stop 308 that includes $Al_xO_y$, a hydrofluoric-based (HF-based) wet etch that is selective to polysilicon and insulator fill 310 can be used to selectively remove etch stop 308. In the case of a bi-layer or bi-phase etch stop 308 that includes an outer layer or portion comprising $Al_xO_y$ and an inner layer or portion comprising $SiO_x$, an HF-based wet etch that is selective to insulator fill 310 can be used to selectively remove the high-k outer layer or portion of etch stop 308, and a secondary dry etch process that is selective to polysilicon and insulator fill 310 can be used to remove the $SiO_x$ layer or portion of etch stop 308. Again, note that the inner and outer layers of etch stop 308 can be reversed, which would in turn reverse the order in which the primary and secondary etchants are applied, and that other materials systems can be used that provide the etch selectivity variously described herein.

With further reference to FIG. 2, the process 200 continues at 216 with depositing a conductive material into the holes to form contacts on the polysilicon wordlines. FIG. 3I shows holes 314 filled with a conductive material to form contacts (or vias) 316, in accordance with an embodiment. The conductive material can be deposited using any suitable deposition technique, such as ALD, CVD, PVD, or of combination of such techniques. Any excess deposited conductive material may be etched or planarized (e.g., by way of CMP) to make the top surface of the conductive material in contacts 316 co-planar (or substantially co-planar) with the top surface of hardmask 312, as generally shown in FIG. 3I. In other embodiments, note that hardmask 312 can be removed as well, during such CMP process. Example conductive materials include polysilicon, tungsten, aluminum, nickel, silver, and copper, to name a few examples. In some example embodiments, note that the contacts 316 may include multiple components or layers, such as a barrier layer or liner (e.g., titanium or titanium nitride, tantalum or tantalum nitride) to prevent migration of the core contact material (e.g., copper, aluminum, tungsten, etc.) into the fill material 310.

Although the techniques provided herein can be used on any staircase structures, they are particularly useful with respect to structures where the height differential between the respective contacts (or vias) 316 on the top and bottom steps is in the range 5× to 80×. In some such embodiments, the height differential between the shortest and tallest contacts 316 is about 10×, or 20×, or 30×, or 40×, or 50×, or 60×, or 70×, or 80×. For instance, in one specific such example embodiment, the shortest contact 316 is about 200 nm to 300 nm tall (e.g., ~250 nm), and the tallest contact 316 is about 9 microns to 10 microns tall (e.g., ~9.8 microns), thereby providing a height differential in the range of about 30× to 50× (e.g., ~39×).

The diameter or width of the contacts 316 can vary as well, but in some embodiments is in the range of about 75 nm to 350 nm. Note that the shape of the contact holes 314 (as well as contacts 316) may vary from one embodiment to the next, depending on factors such as mask shape and hole etch process, but in some cases the holes 314 (and contacts 316) are round. Other hole/via shapes might include, for instance, ovoid-shaped or trench-shaped or rectangular-shaped or square-shaped, or any other shape suitable for a given application. Further note that the width may change along the height of the contact hole, such as in cases where the hole is tapered from a first width near the hole bottom to a relatively greater width at the hole top.

As will be further appreciated, note that the height-to-width aspect ratio of the tallest contacts 316 (or holes 314) can be very high, such as 20:1 or higher. For instance, for a contact hole 314 (or contact 316) having a diameter in the range of 100 nm to 300 nm (e.g., ~200 nm) and a height in the range of 9 microns to 10 microns tall (e.g., ~9.5 microns), the height-to-width aspect ratio would be in the range of 30:1 to 100:1 (e.g., ~48:1).

Contacts 316 bring the wordlines 306 to the top of the structure. Contacts 316 can be further routed by way of an interconnect structure (one or more metallization layers) to connect them back down to integrated circuitry, such as the CMOS logic, on substrate 302, and/or to other locations within the integrated circuit structure. Interconnect processing can be completed as desired. Such additional processing can include completing the back-end-of-line (BEOL) processes, such as vias and interconnects, of 3D NAND memory fabrication.

Example System

Figure 4:
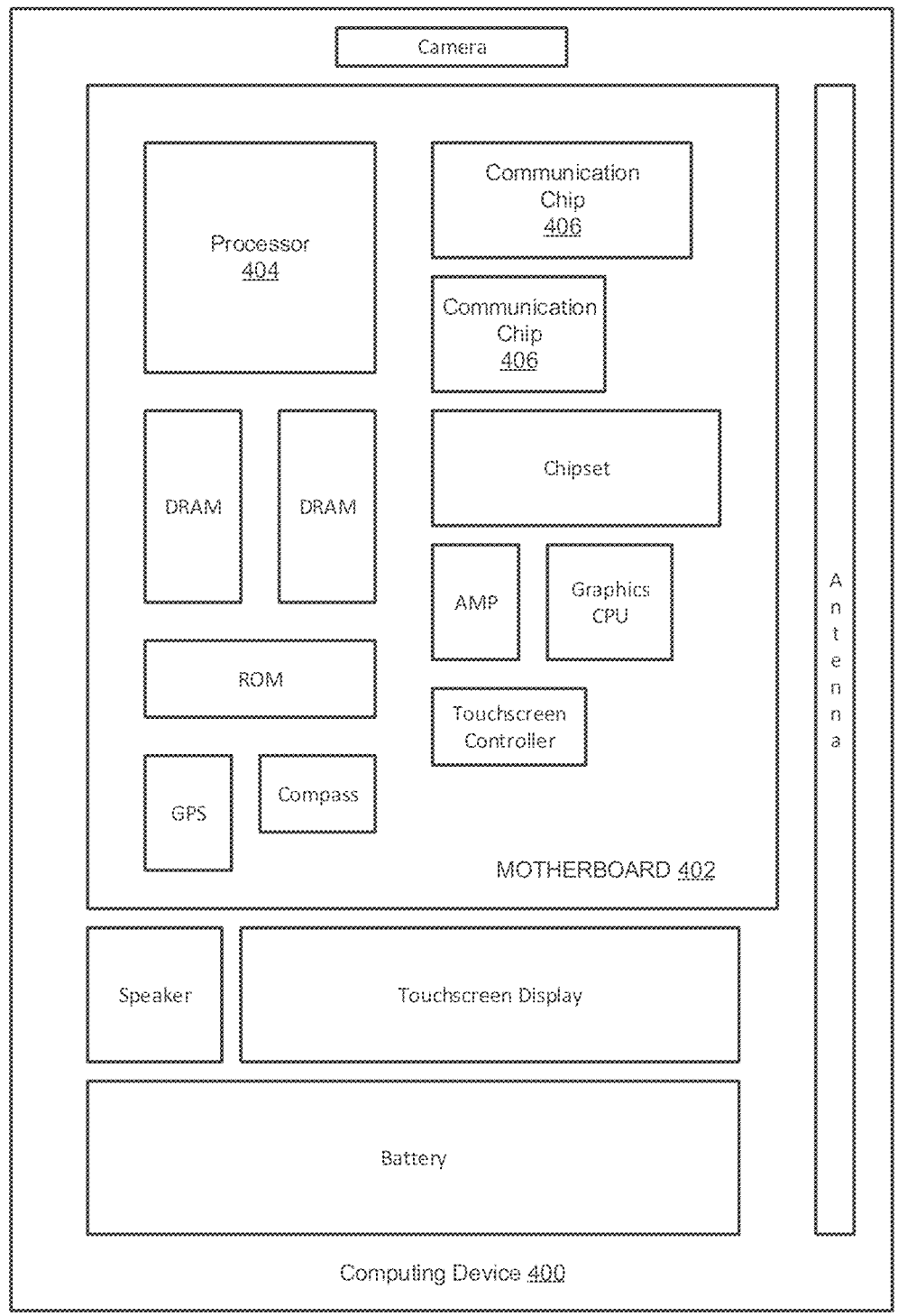
FIG. 4 is an example computing system implemented with one or more of the 3D integrated circuit staircase structures as disclosed herein, in accordance with an embodiment of the present disclosure.

FIG. 4 is an example computing system 400 implemented with one or more of the 3D integrated circuit structures as disclosed herein, in accordance with an embodiment of the present disclosure. As can be seen, computing system 400 houses a motherboard 402. Motherboard 402 may include a number of components, including, but not limited to, a processor 404 and at least one communication chip 406, each of which can be physically and electrically coupled to motherboard 402, or otherwise integrated therein. As will be appreciated, motherboard 402 may be, for example, any printed circuit board, whether a main board, a daughterboard mounted on a main board, or the only board of system 400, etc.

Depending on its applications, computing system 400 may include one or more other components that may or may not be physically and electrically coupled to motherboard 402. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with the disclosed techniques in accordance with an example embodiment (e.g., a high-k containing etch stop provisioned over a staircase or other integrated circuit structure having a diverse set of contact hole depths (or contact heights) that are simultaneously etched in a timed etch process, as variously described herein). In some embodiments, multiple functions can be integrated into one or more chips (e.g., for instance, note that communication chip 406 can be part of or otherwise integrated into processor 404).

Communication chip 406 enables wireless communications for the transfer of data to and from computing system 400. The term wireless and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1x evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. Computing system 400 may include multiple communication chips 406. For instance, a first communication chip 406 may be dedicated to shorter range wireless communications such as Wi-Fi and Bluetooth, and a second communication chip 406 may be dedicated to longer range wireless communications such as GPS, EDGE, GPRS, CDMA, WiMAX, LTE, Ev-DO, and others. In some embodiments, communication chip 406 may include one or more 3D staircase structures having an etch stop thereon that includes a high-k dielectric material as variously described herein.

Processor 404 of computing system 400 includes an integrated circuit die packaged within processor 404. In some embodiments, the integrated circuit die of the processor includes onboard circuitry that is implemented with one or more integrated circuit structures or devices formed using techniques as variously described herein. The term processor may refer to any device or portion of a device that processes, for instance, electronic data from registers and/or memory to transform that electronic data into other electronic data that may be stored in registers and/or memory.

Communication chip 406 also may include an integrated circuit die packaged within communication chip 406. In accordance with some such example embodiments, the integrated circuit die of the communication chip includes one or more integrated circuit structures or devices formed using techniques as variously described herein. As will be appreciated in light of this disclosure, note that multi-standard wireless capability may be integrated directly into processor 404 (e.g., where functionality of any chips 406 is integrated into processor 404, rather than having separate communication chips). Further note that processor 404 may be a chipset having such wireless capability. In short, any number of processors 404 and/or communication chips 406 can be used. Likewise, any one chip or chipset can have multiple functions integrated therein.

In various implementations, computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using techniques as variously described herein.

Further Example Embodiments

The following examples pertain to further embodiments, from which numerous permutations and configurations will be apparent.

Example 1 includes an integrated circuit including: a memory staircase structure, wherein first and second steps included in the staircase structure each comprises an insulator material layer and a conductive material layer; an etch stop on the staircase structure, the etch stop including a high-k dielectric material; an insulator fill material on the etch stop; a first contact that passes through the etch stop and is on the conductive material layer of the first step, wherein the first contact has a first height; and a second contact that passes through the etch stop and is on the conductive material layer of the second step, wherein the second contact has a second height that is more than 5× greater than the first height.

Example 2 includes the subject matter of Example 1, wherein the high-k dielectric material is or otherwise includes aluminum oxide ($Al_xO_y$).

Example 3 includes the subject matter of Example 1 or 2, wherein the high-k dielectric material is or otherwise includes hafnium oxide ($HfO_x$).

Example 4 includes the subject matter of any of the preceding Examples, wherein the high-k dielectric material is or otherwise includes yttrium oxide ($Y_xO_y$).

Example 5 includes the subject matter of any of the preceding Examples, wherein the high-k dielectric material is or otherwise includes zirconium oxide ($ZO_x$).

Example 6 includes the subject matter of any of the preceding Examples, wherein the etch stop is a multi-layer structure, wherein a first layer of the etch stop includes oxygen and one or both of silicon and nitrogen, and the second layer of the etch stop includes the high-k dielectric material.

Example 7 includes the subject matter of Example 6, wherein the second layer is on the first layer, and the first layer is on the conductive material layer of the respective step.

Example 8 includes the subject matter of Example 6, wherein the second layer is on the conductive material layer of the respective step, and the first layer is on the second layer.

Example 9 includes the subject matter of any of Examples 6 through 8, wherein the high-k dielectric material comprises aluminum and oxygen. In other examples, the high-k dielectric material comprises oxygen and one or more of hafnium, aluminum, zirconium, and yttrium.

Example 10 includes the subject matter of any of the preceding Examples, wherein the etch stop is a multi-phase structure, wherein a first phase of the etch stop includes oxygen and one or both of silicon and nitrogen, and the second phase of the etch stop includes the high-k dielectric material.

Example 11 includes the subject matter of Example 10, wherein the second phase is proximate the first layer, and the first phase is proximate the conductive material layer of the respective step.

Example 12 includes the subject matter of Example 10, wherein the second phase is proximate the conductive material layer of the respective step, and the first phase is proximate the second layer.

Example 13 includes the subject matter of any of Examples 10 through 12, wherein the high-k dielectric material comprises aluminum and oxygen. In other examples, the high-k dielectric material comprises oxygen and one or more of hafnium, aluminum, zirconium, and yttrium.

Example 14 includes the subject matter of any of the preceding Examples, wherein the etch stop is a multi-layer structure that includes a first layer and a second layer, and one or both of the first and second layers comprises multiple phases.

Example 15 includes the subject matter of Example 14, wherein the first layer is on the conductive material layer of the respective step and comprises a first phase and a second phase, each of the first and second phases comprising oxygen and at least one of silicon and nitrogen, and the second layer is on the first layer and comprises the high-k dielectric material.

Example 16 includes the subject matter of Example 14 or 15, wherein the first layer is on the conductive material layer of the respective step and comprises the high-k dielectric material, and the second layer is on the first layer and comprises a first phase and a second phase, each of the first and second phases comprising oxygen and at least one of silicon and nitrogen.

Example 17 includes the subject matter of any of Examples 14 through 16, wherein the first layer is on the conductive material layer of the respective step and comprises oxygen and one or both of silicon and nitrogen, and the second layer is on the first layer and comprises a first phase and a second phase, wherein one the first and second phases comprises the high-k dielectric material and the other of the first and second phases comprises a different high-k dielectric material.

Example 18 includes the subject matter of any of Examples 14 through 17, wherein the first layer is on the conductive material layer of the respective step and comprises a first phase and a second phase, wherein one the first and second phases comprises the high-k dielectric material and the other of the first and second phases comprises a different high-k dielectric material, and the second layer is on the first layer and comprises oxygen and one or both of silicon and nitrogen.

Example 19 includes the subject matter of any of the preceding Examples, wherein the conductive material layers of the first and second steps include polysilicon. Other examples might include, for instance, copper, aluminum, tungsten, nickel, titanium, silicide, germanide, or some alloy of any of these.

Example 20 includes the subject matter of any of the preceding Examples, wherein etch selectivity of the high-k dielectric material with respect to the insulator fill material is more than 15 times, such that the insulator fill material etches more than 15 times faster than the high-k dielectric material, for a given etch process.

Example 21 includes the subject matter of any of the preceding Examples, wherein the etch stop has a thickness in the range of 80 nm to 120 nm.

Example 22 includes the subject matter of any of the preceding Examples, wherein the second contact has a second height that is more than 10× greater than the first height. Or more than 12.5× greater, or more than 15× greater, or more than 17.5× greater.

Example 23 includes the subject matter of any of the preceding Examples, wherein the second contact has a second height that is more than 20× greater than the first height. Or more than 22.5× greater, or more than 25× greater, or more than 27.5× greater.

Example 24 includes the subject matter of any of the preceding Examples, wherein the second contact has a second height that is more than 30× greater than the first height. Or more than 32.5× greater, or more than 35× greater, or more than 37.5× greater.

Example 25 includes the subject matter of any of the preceding Examples, wherein the second contact has a second height that is more than 35× greater than the first height. Or more than 37.5× greater, or more than 40× greater, or more than 42.5× greater.

Example 26 includes the subject matter of any of the preceding Examples, wherein the high-k dielectric material comprises aluminum and oxygen, the insulator fill material comprises silicon and oxygen, the insulator material layers comprise silicon and oxygen, the conductive material layers comprise polysilicon or a metal, and the first and second contacts comprise a metal. In other examples, the high-k dielectric material comprises oxygen and one or more of hafnium, aluminum, zirconium, and yttrium.

Example 27 includes the subject matter of any of the preceding Examples, wherein the first and second contacts comprise a metal and one or more nitrides.

Example 28 includes the subject matter of any of the preceding Examples, wherein the first and second contacts have a width or diameter in the range of 100 nm to 300 nm.

Example 29 includes the subject matter of any of the preceding Examples, wherein the second contact has a height-to-width aspect ratio of 35:1 or higher.

Example 30 includes the subject matter of any of the preceding Examples, wherein the second contact has a height-to-width aspect ratio of 45:1 or higher.

Example 31 includes the subject matter of any of the preceding Examples, wherein the second contact has a height-to-width aspect ratio of 75:1 or higher.

Example 32 includes the subject matter of any of the preceding Examples, wherein the second contact has a height-to-width aspect ratio of 90:1 or higher.

Example 33 is a memory device or printed circuit board (PCB) including the integrated circuit of any of the preceding Examples.

Example 34 includes the subject matter of Example 33, wherein the memory device or PCB includes NAND memory.

Example 35 includes the subject matter of Example 33 or 34, wherein the memory device is part of a processor. The processor may be mounted on the PCB.

Example 36 is an integrated circuit comprising: a memory staircase structure, wherein first and second steps included in the staircase structure each includes an insulator layer and a conductive layer; an etch stop on the staircase structure, the etch stop including a high-k dielectric material; an oxide fill material on the etch stop; a first contact that passes through the oxide fill material and etch stop and is on the conductive layer of the first step, wherein the first contact has a first height; and a second contact that passes through the oxide fill material and etch stop and is on the conductive layer of the second step, wherein the second contact has a second height that is more than 25× greater than the first height; wherein etch selectivity of the high-k dielectric material with respect to the oxide fill material is more than 15 times, such that the oxide fill material etches more than 15 times faster than the high-k dielectric material, for a given etch process.

Example 37 includes the subject matter of Example 36, wherein the etch stop is a multi-layer structure, wherein a first layer of the etch stop includes oxygen and one or both of silicon and nitrogen, and the second layer of the etch stop includes the high-k dielectric material.

Example 38 includes the subject matter of Example 37, wherein the second layer is on the first layer, and the first layer is on the conductive layer of the respective step.

Example 39 includes the subject matter of Example 37, wherein the second layer is on the conductive layer of the respective step, and the first layer is on the second layer.

Example 40 includes the subject matter of any of Examples 36 through 39, wherein the etch stop is a multiphase structure, wherein a first phase of the etch stop includes oxygen and one or both of silicon and nitrogen, and the second phase of the etch stop includes the high-k dielectric material.

Example 41 includes the subject matter of Example 40, wherein the second phase is proximate the first layer, and the first phase is proximate the conductive layer of the respective step.

Example 42 includes the subject matter of Example 40, wherein the second phase is proximate the conductive layer of the respective step, and the first phase is proximate the second layer.

Example 43 includes the subject matter of any of Examples 36 through 42, wherein the etch stop is a multilayer structure that includes a first layer and a second layer, and one or both of the first and second layers comprises multiple phases.

Example 44 includes the subject matter of Example 43, wherein the first layer is on the conductive layer of the respective step and comprises a first phase and a second phase, each of the first and second phases comprising oxygen and at least one of silicon and nitrogen, and the second layer is on the first layer and comprises the high-k dielectric material.

Example 45 includes the subject matter of Example 43 or 44, wherein the first layer is on the conductive layer of the respective step and comprises the high-k dielectric material, and the second layer is on the first layer and comprises a first phase and a second phase, each of the first and second phases comprising oxygen and at least one of silicon and nitrogen.

Example 46 includes the subject matter of any of Examples 43 through 45, wherein the first layer is on the conductive layer of the respective step and comprises oxygen and one or both of silicon and nitrogen, and the second layer is on the first layer and comprises a first phase and a second phase, wherein one the first and second phases comprises the high-k dielectric material and the other of the first and second phases comprises a different high-k dielectric material.

Example 47 includes the subject matter of any of Examples 43 through 45, wherein the first layer is on the conductive layer of the respective step and comprises a first phase and a second phase, wherein one the first and second phases comprises the high-k dielectric material and the other of the first and second phases comprises a different high-k dielectric material, and the second layer is on the first layer and comprises oxygen and one or both of silicon and nitrogen.

Example 48 is an integrated circuit comprising: a 3D NAND memory staircase structure, wherein first and second steps included in the staircase structure each includes an oxide layer and a polysilicon layer; an etch stop on the staircase structure, the etch stop including aluminum oxide, wherein the etch stop has a thickness in the range of 50 nm to 150 nm; an oxide fill material on the etch stop; a first contact that passes through the oxide fill material and etch stop and is on the polysilicon layer of the first step, wherein the first contact has a first height; and a second contact that passes through the oxide fill material and etch stop and is on the polysilicon layer of the second step, wherein the second contact has a second height that is more than 35× greater than the first height, and the second contact has a height-to-width aspect ratio of 25:1 or higher; wherein etch selectivity of the high-k dielectric material with respect to the oxide fill material is more than 15 times, such that the oxide fill material etches more than 15 times faster than the high-k dielectric material, for a given etch process.

Example 49 is a memory device including the integrated circuit of Example 48.

Example 50 includes the subject matter of Example 49, wherein the memory device is part of a processor or a printed circuit board (PCB).

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit comprising:
   a memory staircase structure, wherein first and second steps included in the staircase structure each comprises an insulator material layer and a conductive material layer;
   an etch stop on the staircase structure, the etch stop including a high-k dielectric material, wherein the etch stop is a multi-layer structure that includes a first layer and a second layer, and one or both of the first and second layers comprises multiple phases;
   an insulator fill material on the etch stop;
   a first contact that passes through the etch stop and is on the conductive material layer of the first step, wherein the first contact has a first height; and
   a second contact that passes through the etch stop and is on the conductive material layer of the second step, wherein the second contact has a second height that is more than 5× greater than the first height.

2. The integrated circuit of claim 1, wherein the first layer is on the conductive material layer of the respective step and comprises a first phase and a second phase, each of the first and second phases comprising oxygen and at least one of silicon and nitrogen, and the second layer is on the first layer and comprises the high-k dielectric material.

3. The integrated circuit of claim 2, wherein the high-k dielectric material comprises aluminum and oxygen.

4. The integrated circuit of claim 1, wherein the first layer is on the conductive material layer of the respective step and comprises the high-k dielectric material, and the second layer is on the first layer and comprises a first phase and a second phase, each of the first and second phases comprising oxygen and at least one of silicon and nitrogen.

5. The integrated circuit of claim 4, wherein the high-k dielectric material comprises aluminum and oxygen.

6. The integrated circuit of claim 1, wherein the first layer is on the conductive material layer of the respective step and comprises oxygen and one or both of silicon and nitrogen, and the second layer is on the first layer and comprises a first phase and a second phase, wherein one of the first and second phases comprises the high-k dielectric material and the other of the first and second phases comprises a different high-k dielectric material.

7. The integrated circuit of claim 1, wherein the first layer is on the conductive material layer of the respective step and comprises a first phase and a second phase, wherein one of the first and second phases comprises the high-k dielectric material and the other of the first and second phases comprises a different high-k dielectric material, and the second layer is on the first layer and comprises oxygen and one or both of silicon and nitrogen.

8. The integrated circuit of claim 1, wherein the etch stop has a thickness in the range of 80 nm to 120 nm and the first and second contacts have a width or diameter in the range of 100 nm to 300 nm.

9. The integrated circuit of claim 1, wherein the second contact has a second height that is more than 20× greater than the first height.

10. An integrated circuit comprising:
    a memory staircase structure, wherein first and second steps included in the staircase structure each includes an insulator layer and a conductive layer;
    an etch stop on the staircase structure, the etch stop including a high-k dielectric material, wherein the etch stop is a multi-layer structure that includes a first layer and a second layer, and one or both of the first and second layers comprises multiple phases;
    an oxide fill material on the etch stop;
    a first contact that passes through the oxide fill material and etch stop and is on the conductive layer of the first step, wherein the first contact has a first height; and
    a second contact that passes through the oxide fill material and etch stop and is on the conductive layer of the second step, wherein the second contact has a second height that is more than 25× greater than the first height;
    wherein etch selectivity of the high-k dielectric material with respect to the oxide fill material is more than 15 times, such that the oxide fill material etches more than 15 times faster than the high-k dielectric material, for a given etch process.

11. The integrated circuit of claim 10, wherein the first layer of the etch stop is on the conductive layer of the respective step and comprises a first phase and a second phase, each of the first and second phases comprising oxygen and at least one of silicon and nitrogen, and the second layer of the etch stop is on the first layer and comprises the high-k dielectric material.

12. The integrated circuit of claim 11, wherein the high-k dielectric material comprises aluminum and oxygen.

13. The integrated circuit of claim 10, wherein the first layer of the etch stop is on the conductive layer of the respective step and comprises the high-k dielectric material, and the second layer of the etch stop is on the first layer and comprises a first phase and a second phase, each of the first and second phases comprising oxygen and at least one of silicon and nitrogen.

14. The integrated circuit of claim 13, wherein the high-k dielectric material comprises aluminum and oxygen.

15. The integrated circuit of claim 10, wherein the first layer of the etch stop is on the conductive layer of the respective step and comprises oxygen and one or both of silicon and nitrogen, and the second layer of the etch stop is on the first layer and comprises a first phase and a second phase, wherein one the first and second phases comprises the high-k dielectric material and the other of the first and second phases comprises a different high-k dielectric material.

16. The integrated circuit of claim 10, wherein the first layer of the etch stop is on the conductive layer of the respective step and comprises a first phase and a second phase, wherein one of the first and second phases comprises the high-k dielectric material and the other of the first and second phases comprises a different high-k dielectric material, and the second layer of the etch stop is on the first layer and comprises oxygen and one or both of silicon and nitrogen.

17. An integrated circuit comprising:
- a 3D NAND memory staircase structure, wherein first and second steps included in the staircase structure each includes an oxide layer and a polysilicon layer;
- an etch stop on the staircase structure, the etch stop including aluminum oxide, wherein the etch stop has a thickness in the range of 50 nm to 150 nm, and wherein the etch stop is a multi-layer structure that includes a first layer and a second layer, and one or both of the first and second layers comprises multiple phases;
- an oxide fill material on the etch stop;
- a first contact that passes through the oxide fill material and etch stop and is on the polysilicon layer of the first step, wherein the first contact has a first height; and
- a second contact that passes through the oxide fill material and etch stop and is on the polysilicon layer of the second step, wherein the second contact has a second height that is more than 35× greater than the first height, and the second contact has a height-to-width aspect ratio of 25:1 or higher;
- wherein etch selectivity of the aluminum oxide with respect to the oxide fill material is more than 15 times, such that the oxide fill material etches more than 15 times faster than the aluminum oxide, for a given etch process.

18. A memory device including the integrated circuit of claim 17, wherein the memory device is part of a processor.

19. The integrated circuit of claim 17, wherein the first layer of the etch stop is on the polysilicon layer of the respective step and comprises a first phase and a second phase, each of the first and second phases comprising oxygen and at least one of silicon and nitrogen, and the second layer of the etch stop is on the first layer and comprises the aluminum oxide.

20. The integrated circuit of claim 17, wherein the first layer of the etch stop is on the polysilicon layer of the respective step and comprises the aluminum oxide, and the second layer of the etch stop is on the first layer and comprises a first phase and a second phase, each of the first and second phases comprising oxygen and at least one of silicon and nitrogen.

21. The integrated circuit of claim 17, wherein the first layer of the etch stop is on the polysilicon layer of the respective step and comprises oxygen and one or both of silicon and nitrogen, and the second layer of the etch stop is on the first layer and comprises a first phase and a second phase, wherein one the first and second phases comprises the aluminum oxide and the other of the first and second phases comprises a different high-k dielectric material than aluminum oxide.

22. The integrated circuit of claim 17, wherein the first layer of the etch stop is on the polysilicon layer of the respective step and comprises a first phase and a second phase, wherein one of the first and second phases comprises the aluminum oxide and the other of the first and second phases comprises a different high-k dielectric material than aluminum oxide, and the second layer of the etch stop is on the first layer and comprises oxygen and one or both of silicon and nitrogen.

* * * * *

UNITED STATES PATENT AND TRADEMARK OFFICE
CERTIFICATE OF CORRECTION

| | |
|---|---|
| PATENT NO. | : 12,087,693 B2 |
| APPLICATION NO. | : 17/441217 |
| DATED | : September 10, 2024 |
| INVENTOR(S) | : Daniel R. Lamborn, Chuan Sun and Qi Zhou |

It is certified that error appears in the above-identified patent and that said Letters Patent is hereby corrected as shown below:

In the Claims

Column 21, Line 1, Claim 17, should read as follows:
Claim 17: An integrated circuit comprising:
a 3D NAND memory staircase structure, wherein first and second steps included in the staircase structure each includes an oxide layer and a polysilicon layer;
an etch stop on the staircase structure, the etch stop including aluminum oxide, wherein the etch stop has a thickness in the range of 50 nm to 150 nm, and wherein the etch stop is a multi-layer structure that includes a first layer and a second layer, and one or both of the first and second layers comprises multiple phases;
an oxide fill material on the etch stop;
a first contact that passes through the oxide fill material and etch stop and is on the polysilicon layer of the first step, wherein the first contact has a first height; and
a second contact that passes through the oxide fill material and etch stop and is on the polysilicon layer of the second step, wherein the second contact has a second height that is more than 35x greater than the first height, and the second contact has a height-to-width aspect ratio of 25:1 or higher;
wherein etch selectivity of the aluminum oxide with respect to the oxide fill material is more than 15 times, such that the oxide fill material etches more than 15 times faster than the aluminum oxide, for a given etch process.

Signed and Sealed this
Twenty-sixth Day of November, 2024

Katherine Kelly Vidal
*Director of the United States Patent and Trademark Office*